United States Patent [19]

Watanabe et al.

[11] 4,311,963
[45] Jan. 19, 1982

[54] NOISE PULSE SUPPRESSING SYSTEM

[75] Inventors: Masahiro Watanabe, Sagamihara; Hiroshi Horikawa, Kamakura, both of Japan

[73] Assignee: Matsushita Electric Industrial Co., Ltd., Osaka, Japan

[21] Appl. No.: 56,002

[22] Filed: Jul. 9, 1979

[30] Foreign Application Priority Data

Jul. 18, 1978 [JP] Japan .................................. 53-88189
Aug. 31, 1978 [JP] Japan ................................ 53-107124

[51] Int. Cl.³ .............................................. H04B 1/10
[52] U.S. Cl. .................................. 328/163; 328/165; 328/147; 375/104; 455/304
[58] Field of Search ............... 328/165, 147, 162, 163; 375/104; 455/303, 304, 223, 224

[56] References Cited

U.S. PATENT DOCUMENTS

| | | | |
|---|---|---|---|
| 3,588,705 | 6/1971 | Paine | 328/165 X |
| 3,689,845 | 9/1972 | Hepp | 375/104 |
| 4,114,105 | 9/1978 | Duncan | 455/223 |
| 4,156,202 | 5/1979 | Takahashi | 328/163 |
| 4,204,170 | 5/1980 | Kage | 328/165 |
| 4,220,926 | 9/1980 | Buckner | 328/165 |

*Primary Examiner*—John S. Heyman
*Attorney, Agent, or Firm*—Spencer & Kaye

[57] ABSTRACT

A noise pulse suppression system for a receiver comprising holding means for holding an input signal level which precedes immediately the appearance of a noise pulse for a predetermined time duration upon appearance of the noise pulse in an input signal, subtracting means for determining the difference between the input and output of a delay circuit for delaying the input signal or a difference between the delayed output and an output obtained by holding the delayed output for a predetermined time duration, and adding means for adding a correcting signal obtained from the subtracting means to the output of the holding means. The circuit suppresses noise pulses in the input signal and does not generate additional noise.

3 Claims, 6 Drawing Figures

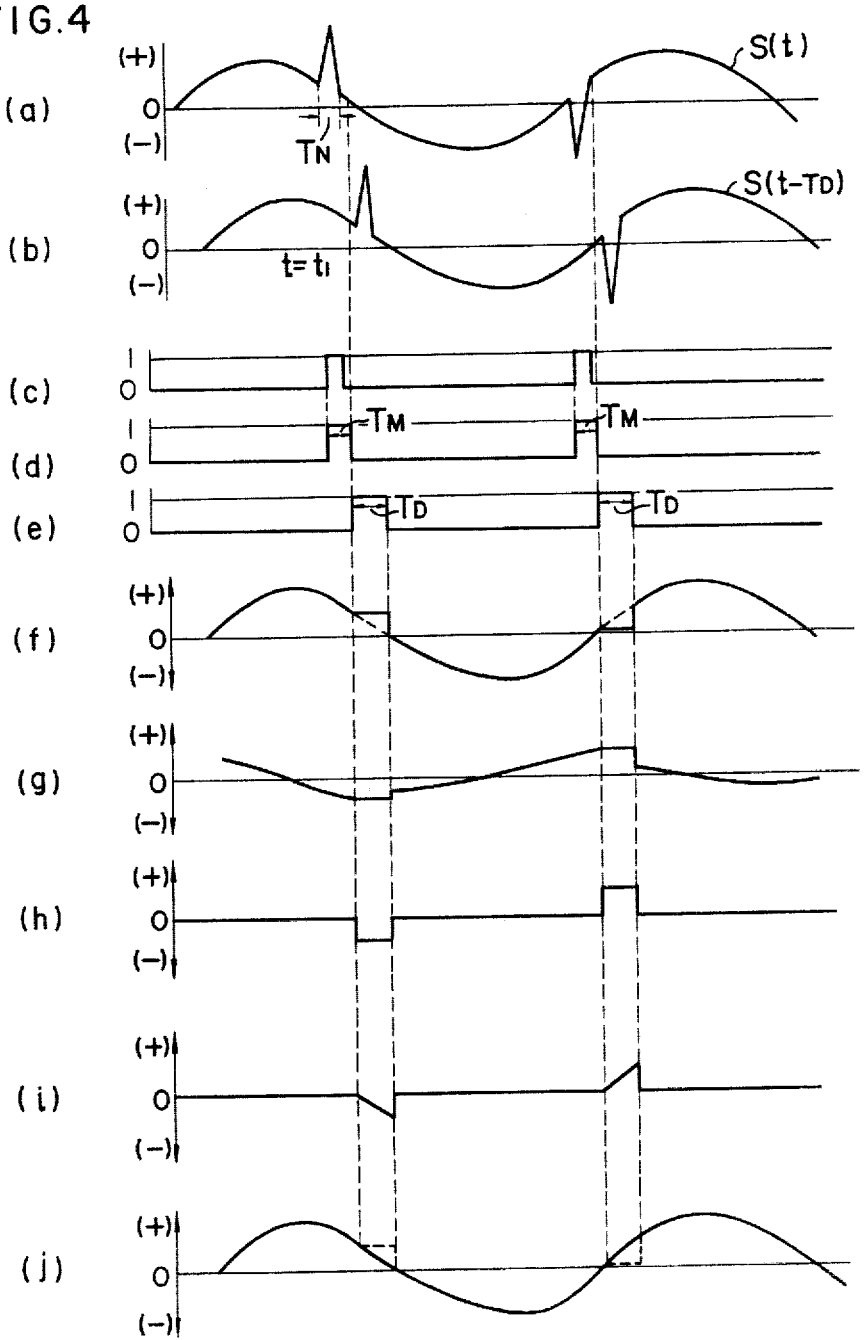

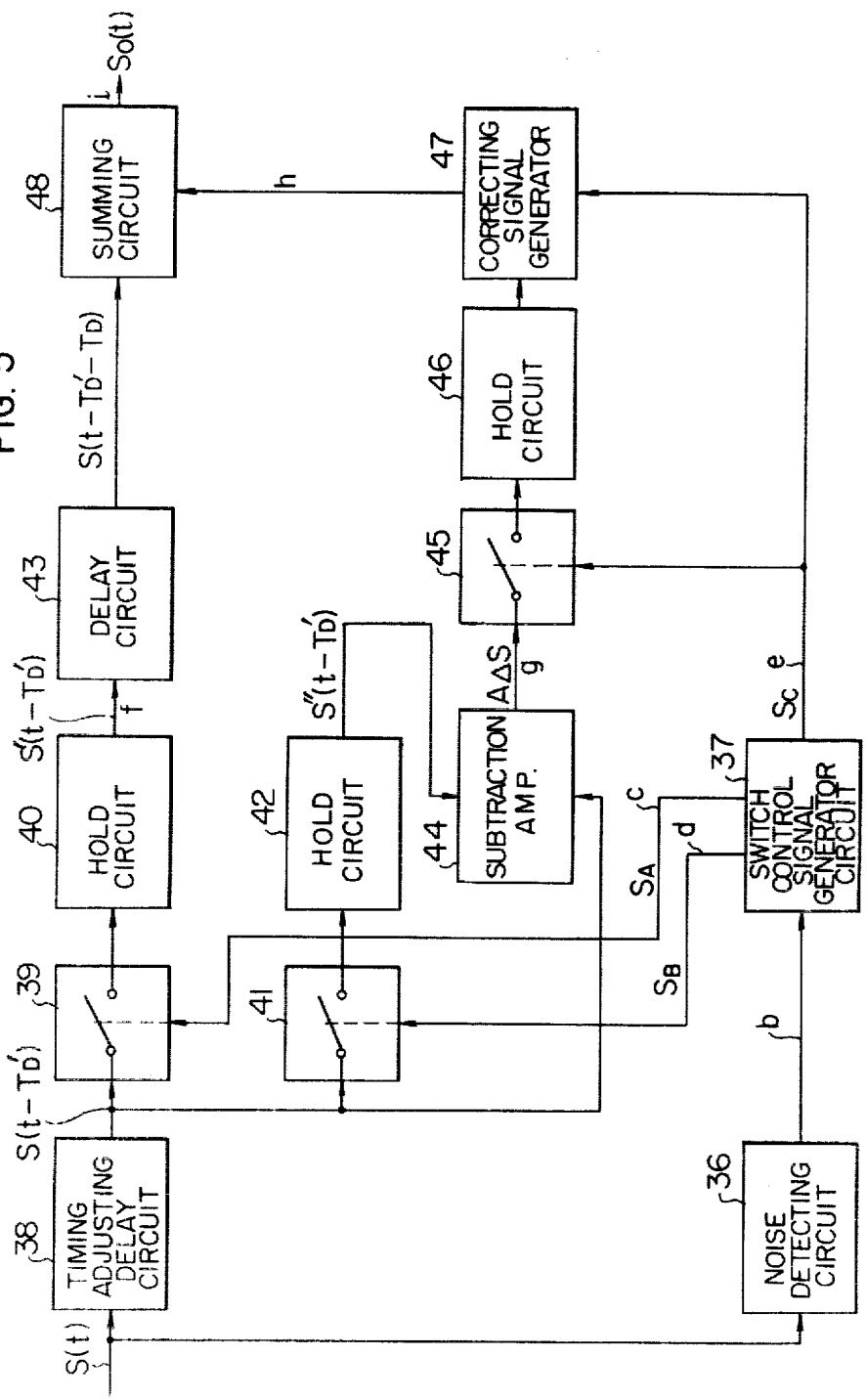

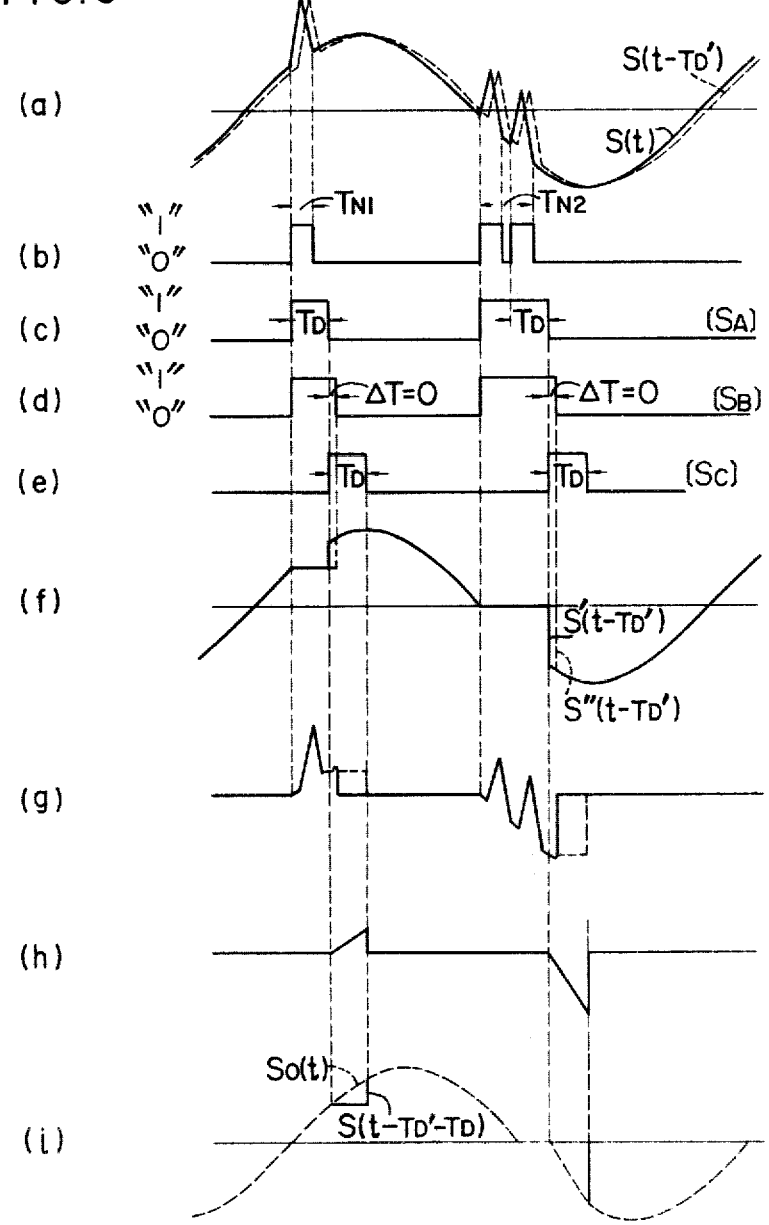

NOISE PULSE SUPPRESSING SYSTEM

BACKGROUND OF THE INVENTION

The present invention relates to a noise pulse suppressing system for suppressing noise pulses superposed on a voice frequency band signal in a receiver for a motor vehicle or the like.

In radio receivers for motor vehicles or the like, it is of course desirable to provide means for suppressing pulse-like noise that may be superposed on signals in the voice frequency band.

BRIEF DESCRIPTION OF THE DRAWINGS

FIG. 4 is a diagram showing signal waveforms to illustrate the operation of the circuit shown in FIG. 3.

FIG. 5 is a block diagram of the noise pulse suppressing system according to another embodiment of the invention.

FIG. 6 is a diagram showing signal waveforms to illustrate the operation of the circuit shown in FIG. 5.

DESCRIPTION OF THE PRIOR ART

Figure 1:
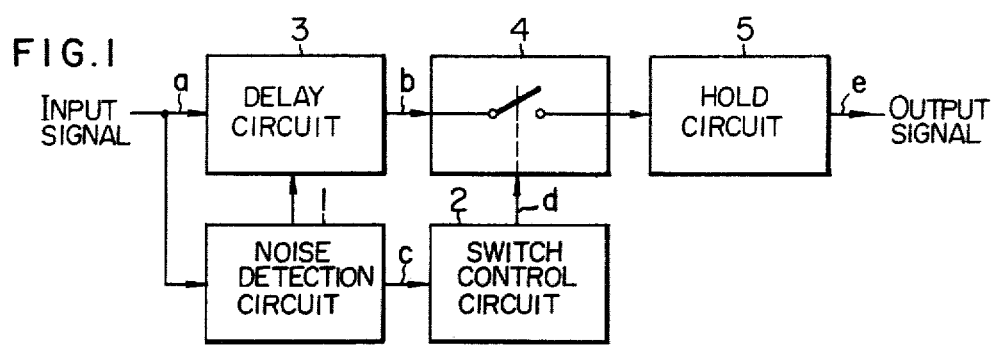
FIG. 1 is a block diagram of a circuit employed in a hitherto known noise pulse suppressing system.

Pulse-like noise suppressing systems of various types have been hitherto known as disclosed in Japanese Patent Publication No. 7361/1976, U.S. Pat. No. 3,739,285 and West German Patent DPS-2051632, for example. A typical example of the prior art noise suppressing system is schematically shown in FIG. 1, which will be reviewed briefly. In this figure, reference numeral 1 denotes a noise detection circuit, 2 denotes a switch control circuit, 3 denotes a delay circuit, 4 denotes a switch circuit and 5 denotes a hold circuit.

Figure 2:
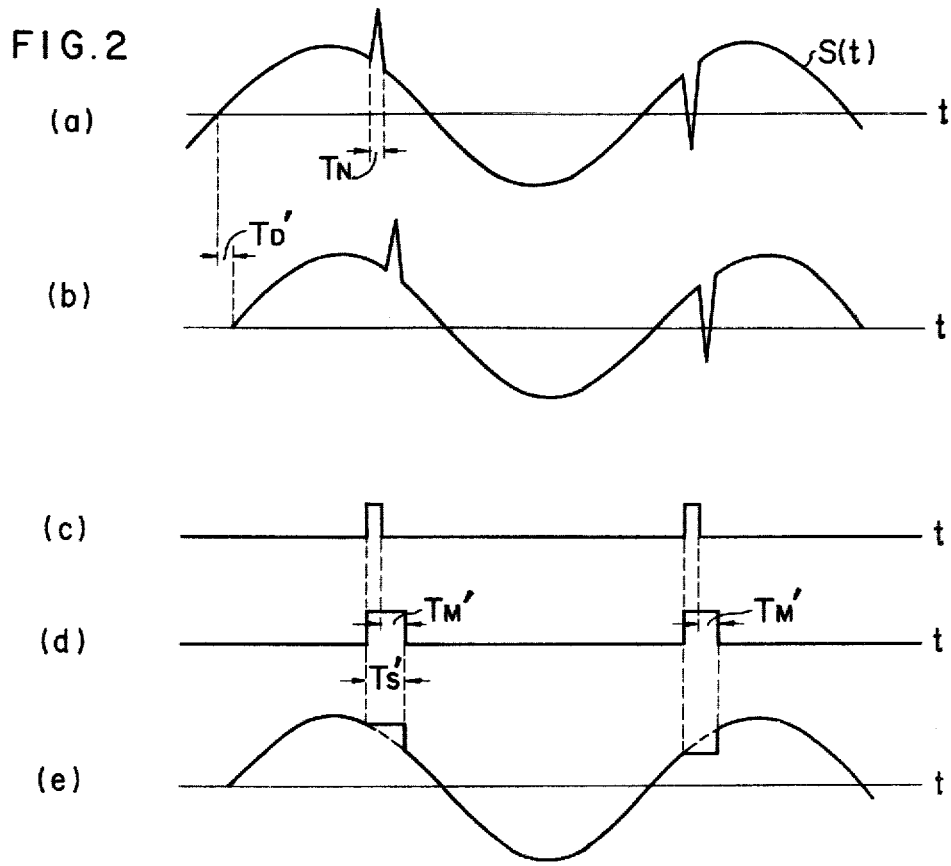
FIG. 2 is a diagram showing signal waveforms to illustrate the operation of the circuit shown in FIG. 1.

In operation, when an input signal $S(t)$ such as shown in FIG. 2(a) is applied to the circuit, the input signal is delayed for a duration $T_D'$ as shown in FIG. 2(b) by the delay circuit 3 which produces thus the output signal $(S(t-T_D'))$. On the other hand, the duration $T_N$ of the noise signal contained in the input signal $S(t)$ is detected by the noise detection circuit 1 as is illustrated in FIG. 2(c) and then converted to a signal such as shown in FIG. 2(d) by the switch control circuit 2. The output signal from the switch control circuit 2 is utilized for controlling the switch circuit 4 thereby to produce the output signal such as shown in FIG. 2(e).

With the circuit arrangement described above, noise suppression may be attained effectively, provided the time interval $T_S'$ during which the switch circuit 4 is blocked is so short as to be negligible as compared with the period of the input signal and that the repetition period of the noise pulse is relatively long as compared with the period of the input signal. However, when the time duration $T_S'$ is relatively short as compared with the period of the input signal, the holding of the signal level at a predetermined level for a predetermined duration will give rise to another new noise source, involving eventually degradation in the S/N ratio and the distortion factor.

SUMMARY OF THE INVENTION

A primary object of the invention is to eliminate the drawbacks of the hitherto known system described above and improve the noise suppression performance of receiver such as car radio receivers, transceivers or the like for noise signals such as those produced in the ignition systems of motor vehicles.

Another object of the invention is to prevent generation of additional noise upon suppression of the incoming noise by superposing an appropriate correcting signal in combination with the suppression of the incoming noise.

A further object of the invention is to prepare the correcting signal from a difference signal derived from the input signal containing the noise pulse and a signal obtained by delaying the input signal for a predetermined duration.

In view of the above objects, there is proposed according to an aspect of the invention a noise pulse suppressing system in which a difference signal is obtained from a signal containing a noise pulse and a predetermined time-signal thereof and first and second hold signals are produced by holding the difference signal and the delayed signal upon appearance of the noise pulse at the signal level preceding immediately the appearance of the noise pulse, wherein a correcting signal prepared from the first hold signal is superposed onto the second hold signal thereby correcting the signal waveform for the noise pulse.

DETAILED DESCRIPTION OF THE PREFERRED EMBODIMENTS

Before entering into a description in conjunction with the accompanying drawings, the principle on which the invention is based will be briefly reviewed. In the first place, a signal $S(t)$ superposed with a noise pulse is fed to a delay circuit having a delay time $T_D$ which is selected to be slightly longer than the time interval $T_N$ during which the noise pulse is superposed. At the time point $(t_1)$ which occurs immediately before the leading edge of the noise pulse appears at the output of the delay circuit as the delayed output signal $S(t-T_D)$, the signal level $S(t_1-T_D)$ at the above time point $(t_1)$ is sampled and held, while at the same time the instant input signal $S(t_1)$ or a difference level signal $\Delta S(t_1)$ between the input and the output signal levels of the delay circuit is latched. The difference level signal can be expressed as follows:

$$\Delta S(t_1) = S(t_1) - S(t_1 - T_D) \quad (1)$$

where $S(t_1)$ represents the normal signal level restored after the trailing edge of the noise pulse has passed through the delay circuit. While the delayed output is maintained at a constant level of $S(t_1-T_D)$, a correction signal $S_c(t')$ is derived from the difference signal $\Delta S(t_1)$ defined by the expression (1), which can be approximately expressed as follows:

$$\frac{\Delta S(t_1)}{T_D} t' \quad (2)$$

where $t'$ represents the time lapse from the time point $t_1$ and is defined to be $0 \leq t' \leq T_D$. By using the correction signal thus obtained, deviation of the delayed output signal from the normal signal waveform is compensated thereby to solve the problem involved in the prior art.

Figure 3:
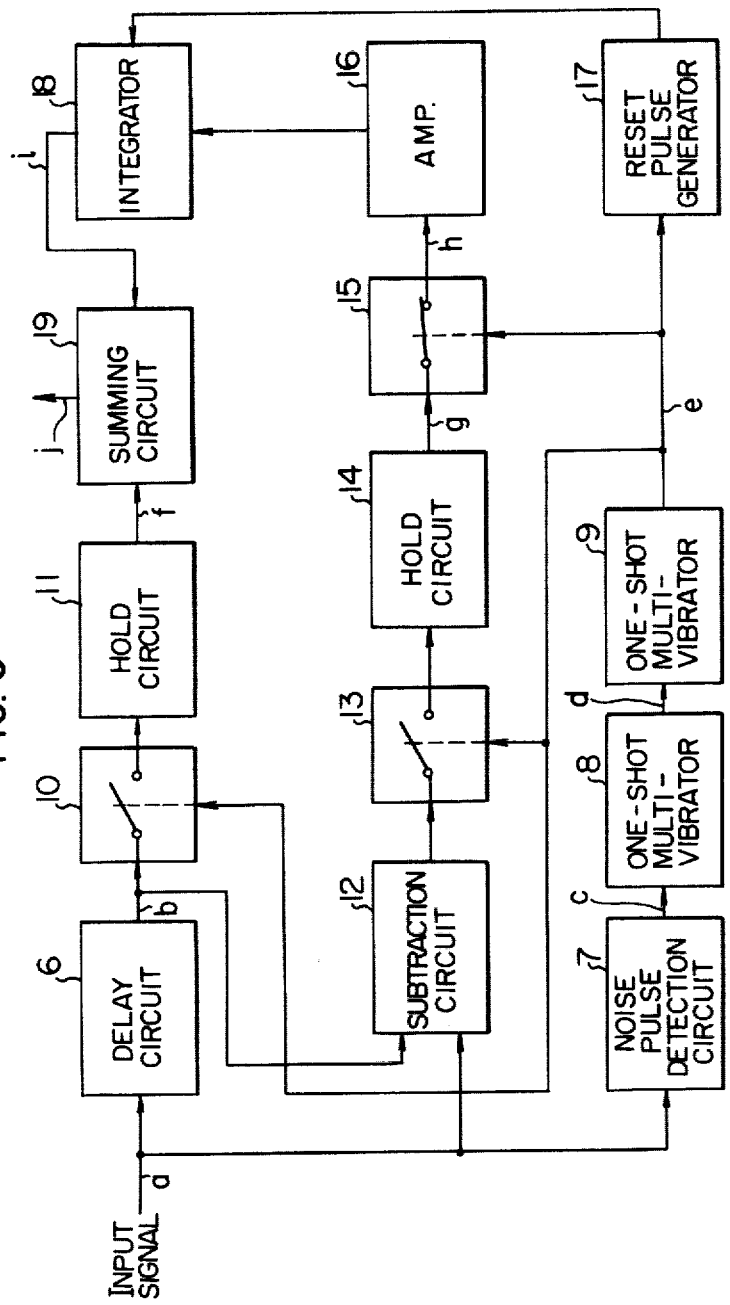
FIG. 3 is a block diagram showing a portion of a receiver which incorporates therein a noise pulse suppressing system according to an embodiment of the invention.

Now, the invention will be described in conjunction with the drawings. Referring to FIG. 3 showing schematically a portion of a receiver of a noise suppressing type according to an embodiment of the invention along with FIG. 4 which illustrates the operation of the circuit shown in FIG. 3, reference numeral 6 denotes a delay circuit which serves to delay an input signal S(t) for a predetermined time $T_D(T_D > T_N)$ and produce an output signal $S(t - T_D)$, numeral 7 denotes a noise pulse detection circuit corresponding to the circuit 1 shown in FIG. 1, numeral 8 denotes a first one-shot multivibrator for producing a pulse signal having a pulse width $T_M$, numeral 9 denotes a second one-shot multivibrator adapted to produce a pulse signal of the predetermined duration $T_D$ in response to the trailing edge of the output pulse from the first multivibrator 8, numeral 12 designates a subtraction circuit for determining the difference between the input and the output signals of the delay circuit 6, numerals 10 and 13 denote, respectively, first and second switch circuits which are interrupted or opened during the logic "1" state of the output from the second one-shot multivibrator 9 and closed during the logic "0" output state thereof, thereby to allow the input signal to pass therethrough, numerals 11 and 14 denote, respectively, first and second signal hold circuits which are destined to sample and hold the input signal level at the time point immediately before the interruption of the switch circuits 10 and 13 in the similar manner as the circuit 5 shown in FIG. 1, numeral 15 denotes a third switch circuit which is adapted to transmit the output signal from the signal hold circuit 14 therethrough during the logic "1" state of the output from the second one-shot multivibrator 9 and is blocked during the logic "0" output state of the multivibrator 9, numeral 16 denotes an amplifier, and reference numeral 17 designates a reset pulse generator for resetting an integrator circuit 18 at the moment when the trailing edge of the output pulse appears at the output of the one-shot multivibrator 9. The integrator circuit 18 integrates the output signal from the amplifier 16 with a predetermined time constant $\tau$. Finally, numeral 19 designates a summing or adder circuit.

Referring to FIG. 4, the signals of the waveforms (a) to (j) illustrated therein correspond to those appearing on the lines labeled by the same reference letters in FIG. 3.

In the circuit arrangement described above and shown in FIG. 3, when the duration $T_M$ of the output pulse from the one-shot multivibrator 8 is so adjusted that the trailing edge of the output pulse from the multivibrator 8 (or the leading edge of the output pulse from the one-shot multivibrator 9) is produced at a time point immediately after the disappearance of the trailing edge of the noise pulse superposed on the received signal at the input side of the delay circuit 6 and immediately before the appearance of the leading edge of the noise pulse superposed on the signal at the output side of the delay circuit 6, the output signal from the signal hold circuit 11 will take the signal level $S(t_1)$ prevailing immediately before the superposition of the noise pulse for the time duration $T_D$ during the interval that the output from the multivibrator 9 is a logic "1". On the other hand, the output from the second signal hold circuit 14 takes the signal level corresponding to the difference $\Delta S(t_1)$ between the signal levels prevailing immediately before and after the superposition of the noise pulse.

Consequently, by adding the signal level represented approximately by $\Delta S(t_1)/T_D \, t'$ to the output signal from the signal hold circuit 11 in the meantime on the assumption that the leading edge of the output pulse from the multivibrator 9 appears at the time point $t'=0$, the output signal level from the summing circuit 19 at the time point $t'=T_D$ will coincide with the output signal level of the delay circuit 6 at the time when the one-shot multivibrator is triggered, resulting in the signal waveform substantially corresponding to the one before the superposition of the noise pulse, as is illustrated in FIG. 4 (j), provided that the following conditions are fulfilled:

$$A \cdot \Delta S(t_1)(1 - e^{-T_d/\tau}) = \Delta S(t_1)$$

To this end, the amplification factor A of the amplifier 16 as well as the integration time constant $\tau$ of the integrator circuit 18 have to be so selected that $A(1-e^{-T_D/\tau})=1$ and that $$A \cdot \Delta S(t_1)\left(1 - e^{-\frac{t'}{\tau}}\right) \approx \frac{\Delta S(t_1)}{T_D} \cdot t_1'$$

during the duration $T_D = 0 \sim t'$.

Detection of the noise pulse may be effected in the RF or IF circuit.

As will be appreciated from the above description, in addition to the gate control such as illustrated in FIG. 1, the superposition of a predetermined correcting signal is effected at the time of the gate control (during the interruption of the received signal) for the detection of the noise pulse. Consequently, suppression of pulse-like noise such as the ignition noise produced in an internal combustion engine of a motor vehicle can be realized effectively.

As a modification of the circuit arrangement shown in FIG. 3, a delay circuit (corresponding to the delay circuit 6 shown in FIG. 3) is additionally provided to delay the signal S(t) superposed with the noise pulse for a predetermined time $T_D$, while the signal level $S(t_1 - T_D)$ sampled at a time point $t_1$ immediately before the appearance of the noise in the output signal $S(t - T_D)$ from the additional delay circuit is held for a time interval until the trailing edge of the noise pulse has passed through the additional delay circuit. In the meantime, (A) if $T_D \geq T_N$, the signal $S(t - T_D)$ is added with a signal given by the following expression:

$$\frac{S(t_1) - S(t_1 - T_D)}{T_D} \times t'$$

where $S(t_1)$ represents the input signal level to the delay circuit and t' represents the time lapse from the time point $t_1$, wherein $0 \leq t' \leq T_D$.

On the other hand, (B) if $T_N \geq T_D$, the signal $S(t - T_D)$ is added to the signal $S(t_1 - T_D)$ itself provided that $0 \leq t' < T_N - T_D$ while added to a signal given by $[S(t_1) - S(t_1 - T_D)]T_D \times [t' - (T_N - T_D)]$ provided that $T_N - T_D \leq t' \leq T_N$.

The sum signal thus obtained is produced as the output signal in place of the delayed output signal superposed with the noise pulse.

In connection with the modification described above, it will be noted that the arithmetic operation (B) will become unnecessary when the delay time $T_D$ is selected such that $T_N \text{ MAX} \leq T_D$, where $T_N \text{ MAX}$ represents the maximum value of the noise pulse width or duration $T_N$. However, then the arithmetic operation (A) described above will be executed definitely during the delay time $T_D$ even when the duration $T_N$ becomes shorter, as the result of which the difference between the waveform having no noise pulse superposed thereon and the waveform produced after the operation (A) becomes greater, involving another source for noise.

The generation of such additional noise can be suppressed to a minimum by setting the delay time $T_D$ slightly longer than the pulse width of the noise which appears relatively frequently and executing the operation (A) described above when $T_N \leq T_D$ while executing the operation B in case $T_N > T_D$ in which the noise is produced less frequently.

FIG. 5 shows a noise suppressing circuit according to another embodiment of the invention which will now be described by referring also to FIG. 6 illustrating the operations thereof. In FIG. 5, reference numeral 36 designates a noise detecting circuit which functions to detect the spike-like noise in the input signal S(t) shown in FIG. 6(a) and produce a detection pulse signal having a pulse width substantially equal to that of the detected noise spike as shown in FIG. 6(b). Numeral 37 denotes a switch control signal generator circuit which may be constituted by three one-shot multivibrators, for example, and produces three kinds of switch control signal outputs. Namely, the first is the switch control signal $S_A$ (refer to FIG. 6(c) which is at the logic "1" level for a predetermined duration $T_D$ (determined by the delay time of a delay circuit 43 described hereinafter) fromthe moment when the logic "1" level appears at the output of the noise detecting circuit 36 and otherwise remains at logic "0" level except that when the output from the noise detecting circuit 36 takes once the logic "0" level during the logic "1" state of the output from the switch control generating circuit 37 and again resumes the logic "1" state, the duration $T_D$ is re-initiated from the moment when the circuit 37 resumes the logic "1" output level which is then changed over to the logic "0" level upon expiration of the duration $T_D$. The second output from the switch control signal generator circuit 37 is a switch control signal $S_B$ (refer to FIG. 6(d)) which goes to the logic "1" level for predetermined duration of $T_D + \Delta T (\Delta T \approx 0)$ from the moment when the output from the detecting circuit 36 becomes logic "1" and otherwise remains logic "0" except that when the output from the noise detecting circuit 36 takes once the logic "0" level during the logic "1" state of the output from the switch control signal generator circuit 37 and resumes again the logic "1", the duration $T_D + \Delta T$ is again initiated in response to the resumption of the logic "1" state of the output from the detecting circuit 36 with the second switch control signal $S_B$ (refer to FIG. 6(d)) being reset to the logic "0" state upon expiration of the duration $T_D + \Delta T$. Finally, the third output from the switch control signal generator circuit 37 is a switch control signal $S_C$ (refer to FIG. 6(e)) which becomes logic "1" for the duration $T_D$ from the instant when the control signal $S_A$ is turned from the logic "1" to the logic "0" state and remains otherwise logic "0". Referring to FIG. 5, numeral 38 designates a timing adjusting delay circuit which serves to delay the signal S(t) for a predetermined duration $T_D'$ such that the input signals to switch circuits 39 and 41 described below are produced immediately preceding the leading edge of the noise pulse at the moment when the control signals $S_A$ and $S_B$ are changed over from the logic "0" to the logic "1" state, thereby producing the output signal $S(t - T_D')$ (refer to the broken curve shown in FIG. 6(a)). The switch circuit 39 responds to the switch control signal $S_A$ of the logic "1" level to block the input signal $S(t - T_D')$ which is allowed to pass through the switch circuit 39 when the control signal $S_A$ is logic "0". On the other hand, the switch circuit 41 blocks the input signal $S(t - T_D')$ in response to the control signal $S_B$ of the logic "1" level and permits the input signal $S(t - T_D')$ to pass when the control signal $S_B$ is logic "0". Numeral 40 and 42 denote hold circuits for holding the input signal levels immediately before the opening of the switch circuits 39 and 41, as indicated by solid and broken lines in FIG. 6(f). Numeral 43 denotes a delay circuit for delaying the output signal $S'(t - T_D')$ from the hold circuit 40 for the predetermined duration $T_D$ thereby producing a delayed signal $S(t - T_D' - T_D)$ (refer to the solid line in FIG. 6(i)), and 44 denotes a substraction amplifier for deriving from the output signal $S(t - T_D')$ from the delay circuit 38 and the output signal $S''(t - T_D')$ from the hold circuit 42 the difference signal $\Delta S(t) = S(t - T_D') - S''(t - T_D')$ and amplifying the resulting difference signal with a predetermined gain A, thereby producing a signal $A \cdot \Delta S(t) = A[S(t - T_D') - S''(t - T_D')]$ as shown in FIG. 6(g). Numeral 45 denotes a switch circuit for blocking the input signal $A \cdot \Delta S(t)$ when the signal $S_C$ is logic "1" and passing the input signal $A \cdot \Delta S(t)$ in response to the signal $S_C$ of the logic "0" level, and numeral 46 denotes a signal hold circuit which serves to hold the input signal level immediately before the blocking state of the switch circuit 45 and otherwise allows the input signal to pass therethrough, thereby to produce an output signal indicated by the broken line in FIG. 6(g). Numeral 47 denotes a correcting signal generator circuit which is constituted by a switch circuit and an integrator circuit which is controlled by the signal $S_C$ so that the input signal is integrated during the logic "1" state of the signal $S_C$ with a preselected integration constant $\tau'$ to produce the output signal $$A \cdot \Delta S(t_1) \left( 1 - e^{-\frac{t'}{\tau'}} \right) \approx \frac{\Delta S(t_1)}{T_D} \cdot t',$$

where t' represents the time lapse from the time point at which the signal $S_C$ becomes a logic "1" and where $0 \leq t' \leq T_D$, while producing the output of logic "0" so long as the signal $S_C$ is a logic "1". Thus, the signal shown in FIG. 6(h) is obtained from the correcting signal generator circuit 47. Finally, reference numeral 48 denotes a summing circuit for producing a sum signal such as shown in FIG. 6(i) from the output signal of the delay circuit 43 and the output signal from the correcting signal generator circuit 47.

As will be appreciated from the foregoing description, the pulse-like noise suppressing effect can be significantly improved due to the appropriate correcting operation according to the invention as compared with the prior art system in which the signal level immediately preceding the appearance of the pulse-like noise is held during the presence thereof.

What is claimed is:

1. A noise pulse suppression system for suppressing a noise pulse superposed on an input signal S(t), where S(t) is the magnitude of said signal as a function of time t, comprising

- a first delay circuit for delaying said input signal including said noise pulse for a predetermined interval;
- a subtraction circuit coupled to said first delay circuit, the output of said subtraction circuit corresponding to one of (1) the difference between the input and output of said first delay circuit and (2) the difference between the output of said first delay circuit and the output of said first delay circuit held for a predetermined interval;
- a first signal holding means coupled to the output of said first delay circuit, said first signal holding means holding for a predetermined interval the level of said input signal existing at a time immediately preceding the appearance of said noise pulse;
- a second signal holding means coupled to the output of said subtraction circuit, said second signal holding means holding the output of said subtraction circuit for a predetermined interval;
- correction means coupled to the output of said second signal holding means for generating a correction signal; and
- a summing circuit for adding said correction signal to the output of said first signal holding means, the output of said summing circuit corresponding substantially to said input signal with said noise pulse suppressed.

2. A noise pulse suppression system as defined in claim 1 wherein said first delay circuit comprises means for delaying said input signal S(t) including said noise pulse for a predetermined period of time $T_D$ to obtain a delayed output signal $S(t-T_D)$;

said subtraction current has a first input coupled to the input of said first delay circuit and a second input coupled to the output of said first delay circuit, the output of said subtraction current being $\Delta S(t) = S(t) - S(t-T_D)$;

said first signal holding means holds a signal level $S(t_1-T_D)$, where $t_1$ is a time immediately preceding the appearance of said delayed noise pulse;

said second signal holding means holds a signal level $\Delta S(t_1)$;

said correction means comprises an integrator circuit for producing a correction signal $$S_c(t') = \frac{\Delta S(t_1)}{T_D} t'$$

where t' is an interval measured from $t_1$ and having a duration between zero and $T_D$; and said summing circuit comprises means for adding said correction signal $S_c(t')$ to the output of said first signal holding means.

3. A noise pulse suppression system as defined in claim 1 which further comprises a second delay circuit interposed between said first holding circuit and said summing circuit, and wherein said first delay circuit comprises means for delaying said input signal S(t) including said noise pulse for a predetermined period of time $T_D'$ to obtain a delayed output signal $S(t-T_D')$;

said subtraction circuit has a first input coupled to the output of said first delay circuit through a third holding means and a second input coupled directly to the output of said first delay circuit, said third holding means holding a signal level $S(t_1-T_D')$, where $t_1$ is a time immediately preceding the appearance of said noise pulse on said input signal, the output of said subtraction circuit being $\Delta S(t) = S(t-T_D') - S(t_1-T_D')$;

said first signal holding means holds a signal level $S(t_1-T_D')$;

said second signal holding means holds a signal level $\Delta S(t)$;

said correction means comprises an integrator circuit for producing a correction signal $$S_c(t') = \frac{\Delta S(t_1)}{T_D} t',$$

where $T_D$ is the delay produced by said second delay circuit and t' is an interval measured from the end of the interval for which said first signal holding means holds the level of said input signal, said time t' having a duration between zero and $T_D$; and said summing circuit comprises means for adding said correction signal $S_c(t')$ to the output of said second delay circuit.

* * * * *